(12) United States Patent
Hoshino

(10) Patent No.: US 11,112,381 B2
(45) Date of Patent: Sep. 7, 2021

(54) MEASUREMENT APPARATUS

(71) Applicant: TOSHIBA MEMORY CORPORATION, Tokyo (JP)

(72) Inventor: Ken Hoshino, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 193 days.

(21) Appl. No.: 16/557,325

(22) Filed: Aug. 30, 2019

(65) Prior Publication Data

US 2020/0292497 A1    Sep. 17, 2020

(30) Foreign Application Priority Data

Mar. 15, 2019  (JP) .............................. JP2019-048609

(51) Int. Cl.
*G01R 33/00*    (2006.01)
*G01N 27/72*    (2006.01)
*G01R 33/12*    (2006.01)

(52) U.S. Cl.
CPC .......... *G01N 27/72* (2013.01); *G01R 33/1253* (2013.01)

(58) Field of Classification Search
CPC .............. G01R 33/00; G01R 33/0035; G01R 33/0023; G01R 33/0017; G01R 33/1253; G01R 31/3191; G01B 7/004; G01C 17/38; G06F 3/017; G06F 3/0346; G06F 3/012; G01N 27/72
See application file for complete search history.

(56) References Cited

U.S. PATENT DOCUMENTS

| | | | |
|---|---|---|---|
| 5,502,369 A | 3/1996 | Niwayama | |
| 6,462,612 B1 | 10/2002 | Roh et al. | |
| 6,788,049 B2 * | 9/2004 | Engdahl | G08B 13/2408 |
| | | | 324/233 |

(Continued)

FOREIGN PATENT DOCUMENTS

| | | |
|---|---|---|
| JP | H03-010180 | 1/1991 |
| JP | 3044319 | 5/2000 |

OTHER PUBLICATIONS

Enz and Temes "Circuit Techniques for Reducing the Effects of Op-Amp Imperfections: Autozeroing, Correlated Double Sampling, and Chopper Stabilization" Proceedings of the IEEE, vol. 84,No. 11,Nov. 1996. 31 pages.

*Primary Examiner* — Jermele M Hollington
*Assistant Examiner* — Taqi R Nasir
(74) *Attorney, Agent, or Firm* — Foley & Lardner LLP

(57) ABSTRACT

According to one embodiment, a measurement apparatus includes a magnetic field generation section that applies a predetermined magnetic field to a device under test. A current source supplies a current of a rectangular wave to the device under test in a direction of crossing the magnetic field. A voltage measurement section measures a voltage difference generated in the device under test. A restoration section demodulates the voltage difference using a demodulated signal having the same frequency as a frequency of the rectangular wave and synchronized with the rectangular wave, removes harmonic components from the demodulated voltage difference, and restores an electromotive voltage generated in the device under test. A computing section measures the device under test using low frequency components of the electromotive voltage.

14 Claims, 3 Drawing Sheets

(56) References Cited

U.S. PATENT DOCUMENTS

| | | | |
|---|---|---|---|
| 7,391,257 B1 * | 6/2008 | Denison | H03F 3/45183 330/9 |
| 7,605,647 B1 | 10/2009 | Romero et al. | |
| 2009/0001976 A1 * | 1/2009 | Cech | B60R 21/0136 324/228 |
| 2009/0267687 A1 | 10/2009 | Romero et al. | |
| 2017/0184688 A1 * | 6/2017 | Nakamura | G01R 33/07 |

* cited by examiner

DUT

MEASUREMENT APPARATUS

CROSS-REFERENCE TO RELATED APPLICATION

This application is based upon and claims the benefit of priority from Japanese Patent Application No. 2019-048609, filed Mar. 15, 2019, the entire contents of which are incorporated herein by reference.

FIELD

Embodiments described herein relate generally to a measurement apparatus.

BACKGROUND

When the Hall effect of a sample such as a semiconductor material is measured, a magnetic field is applied to the sample, and a constant current is fed through the sample in an orthogonal direction to the magnetic field. A measurement apparatus measures a resultant voltage difference. Generally, the measurement apparatus calculates a Hall coefficient using this voltage difference as a Hall electromotive voltage, and further calculates sample conductivity (n or p), a carrier concentration, and a carrier mobility.

However, electrodes are provided on the sample to supply a voltage and a current to the sample. Noise is generated in junction portions between the electrodes and the sample. The mixture of this noise into the Hall electromotive voltage causes an impediment to the accurate calculation of the sample conductivity, the carrier concentration, and the carrier mobility.

Examples of related art include U.S. Pat. No. 7,605,647, US Patent Application Publication No. 2009/0267687, JP-A-H03-010180, Japanese Patent No. 3044319, and "Circuit Techniques for Reducing the Effects of Op-Amp Imperfections: Autozeroing, Correlated Double Sampling, and Chopper Stabilization" Proceedings of the IEEE, Vol. 84, NO. 11, 1584-1614, November 1996.

DETAILED DESCRIPTION

Embodiments provide a measurement apparatus that can accurately calculate sample conductivity, a carrier concentration, and a carrier mobility using an accurate Hall electromotive voltage.

In general, according to one embodiment, a measurement apparatus includes a magnetic field generation section that applies a predetermined magnetic field to a device under test. A current source supplies a current of a rectangular wave to the device under test in a direction of crossing the magnetic field. A voltage measurement section measures a voltage difference generated in the device under test. A restoration section demodulates the voltage difference using a demodulated signal having the same frequency as a frequency of a rectangular wave and synchronized with the rectangular wave current I, removes harmonic components from the demodulated voltage difference, and restores an electromotive voltage generated in the device under test. A computing section measures the device under test using low frequency components of the electromotive voltage.

Embodiments according to the present disclosure will be described hereinafter with reference to the drawings. The present embodiments are not intended to limit the present disclosure. The drawings are either schematic or conceptual and ratios of sections and the like are not necessarily identical to actual ones. In the specification and the drawings, similar elements to those already described with reference to the drawings already referred to are denoted by the same reference signs and description thereof is omitted as appropriate.

Figure 1:
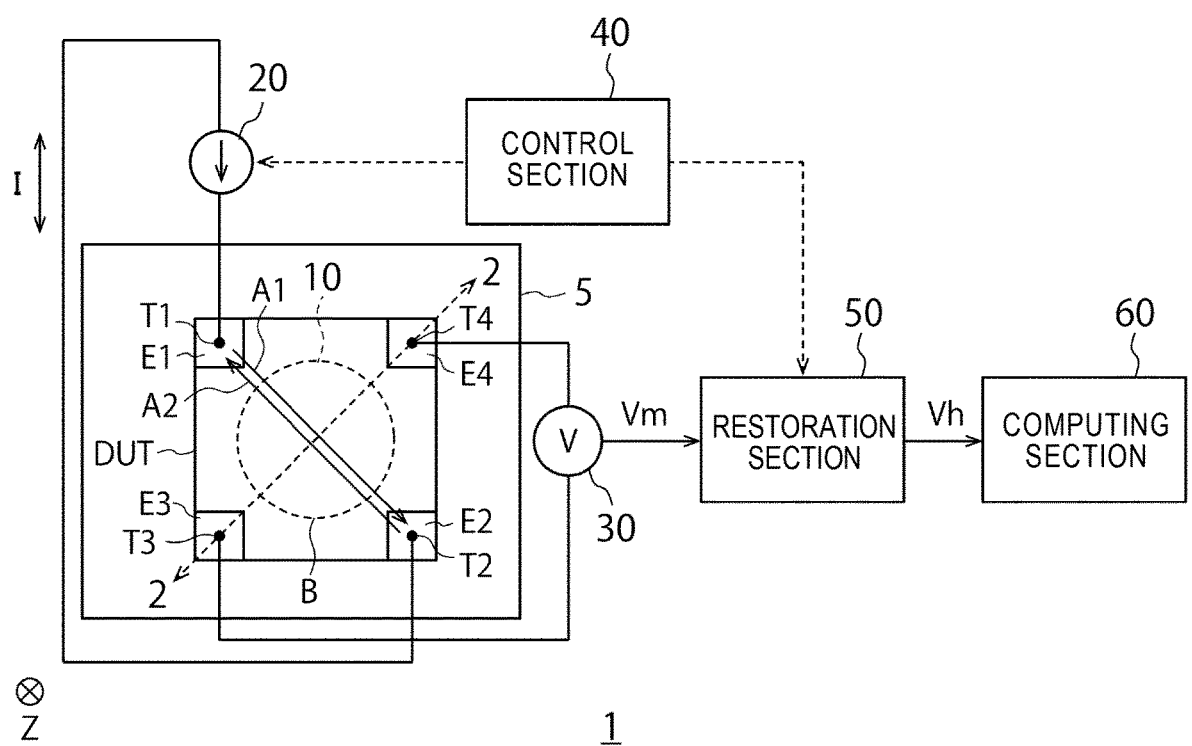
FIG. 1 is a block diagram depicting an example of a configuration of a measurement apparatus according to the present embodiment.

FIG. 1 is a block diagram depicting an example of a configuration of a measurement apparatus according to the present embodiment. A measurement apparatus 1 is an apparatus that measures a Hall effect of a device under test (DUT). The DUT is, for example, a sample of a semiconductor chip and has four electrodes E1 to E4 for measuring the Hall effect. The DUT has, for example, a rectangular parallelepiped or cubic shape, and the electrodes E1 to E4 are provided in four vertex portions, respectively. It is noted that the shape of the DUT may be a symmetrical shape other than the rectangular parallelepiped or the cube. The connections of the two electrodes out of the electrodes E1 to E4 should be arranged to cross connections of the other two electrodes. Furthermore, the number of terminals is not limited to four but may be more than or equal to five. In this case, similarly to the above case, connections of two electrodes corresponding to two terminals out of five terminals can be arranged to cross connections of the other two electrodes.

The measurement apparatus 1 includes first to fourth terminals T1 to T4, a stage 5, a magnetic field generator 10 (which may be sometimes referred to as generation section 10), a current source 20, a voltage detector 30 (which may be sometimes referred to as measurement section 30), a control section 40, a restoration section 50, and a computing section 60.

The stage 5 is configured to be capable of place the DUT thereon. The magnetic field generation section 10 is an apparatus that applies a magnetic field B to the DUT on the stage 5 and is, for example, a permanent magnet or an electromagnet. The magnetic field generation section 10 is disposed either above or below the DUT and applies the magnetic field B to the DUT in a Z direction (paper plane direction) in FIG. 1. The Z direction is generally perpendicular to a front surface of the DUT provided with the electrodes E1 to E4. It is noted that the magnetic field generation section 10 may apply the magnetic field B to the DUT either continuously or intermittently.

The terminals T1 to T4 correspond to the electrodes E1 to E4 of the DUT and are electrically contactable with the electrodes E1 to E4, respectively. The first terminal T1 and the second terminal T2 contact the two electrodes E1 and E2, respectively, and supply a current I from the current source 20 to the DUT. The electrodes E1 and E2 are located at opposite vertexes of the DUT, and the current I is fed through the DUT in a direction denoted by an arrow A1 or A2 along a diagonal that connects the electrodes E1 and E2.

The current source 20 supplies the current I between the first terminal T1 and the second terminal T2. Specifically, the current source 20 supplies a rectangular wave current as the current I. For example, the current source 20 alternately feeds the current I through the DUT in the direction denoted by the arrow A1 and the direction denoted by the arrow A2 at regular intervals. While the arrows A1 and A2 are both along the diagonal of the DUT, the arrows A1 and A2 are opposite in direction. In other words, the current in the A1 direction and the current in the A2 direction are opposite in polarity but substantially identical in a magnitude of an absolute value. The current source 20 feeds the current through the DUT in the A1 direction in a half cycle and feeds the current therethrough in the A2 direction in the next half cycle. The current source 20 instantaneously switches the current between such currents in the A1 direction and the A2 direction and alternately feeds the current through the DUT. The current I thereby becomes the rectangular wave current I having a certain cycle.

The A1 and A2 directions of the rectangular wave current Tare directions of crossing, for example, direction generally orthogonal to, the direction (Z direction) of the magnetic field B. The Lorentz force is thereby applied to carriers (electrons or holes) flowing in the DUT. The Lorentz force is applied to the carriers in an orthogonal direction to the direction (Z direction) of the magnetic field B and the migration direction (A1 or A2 direction) of carriers. This Lorentz force causes generation of a voltage difference Vm in the DUT.

The voltage measurement section 30 measures the voltage difference Vm in the DUT between the third terminal T3 and the fourth terminal T4. The third terminal T3 and the fourth terminal T4 contact the other two electrodes E3 and E4 of the DUT, respectively, and transfer the voltage difference Vm to the voltage measurement section 30. It is preferable that a diagonal direction of connecting the electrodes E3 and E4 is generally orthogonal to the direction (Z direction) of the magnetic field B and the migration direction (A1 or A2 direction) of the carriers. This is because an electromotive voltage (Hall electromotive voltage) (Vh in FIG. 4D) generated in the DUT is maximum if the diagonal direction is defined in this way. However, the diagonal direction of connecting the electrodes E3 and E4 may cross an inclination direction of the Z direction and the A1 and A2 directions without being orthogonal thereto if the Hall electromotive voltage can be extracted by a method to be described later.

Figure 2:
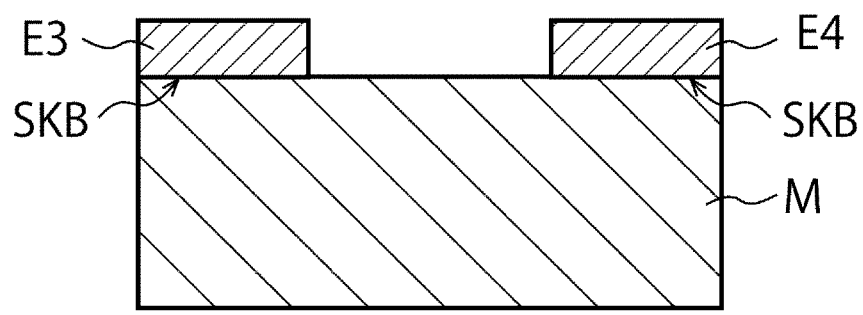
FIG. 2 is a schematic cross-sectional view of a DUT along a line 2-2 of FIG. 1.
Figure 3:
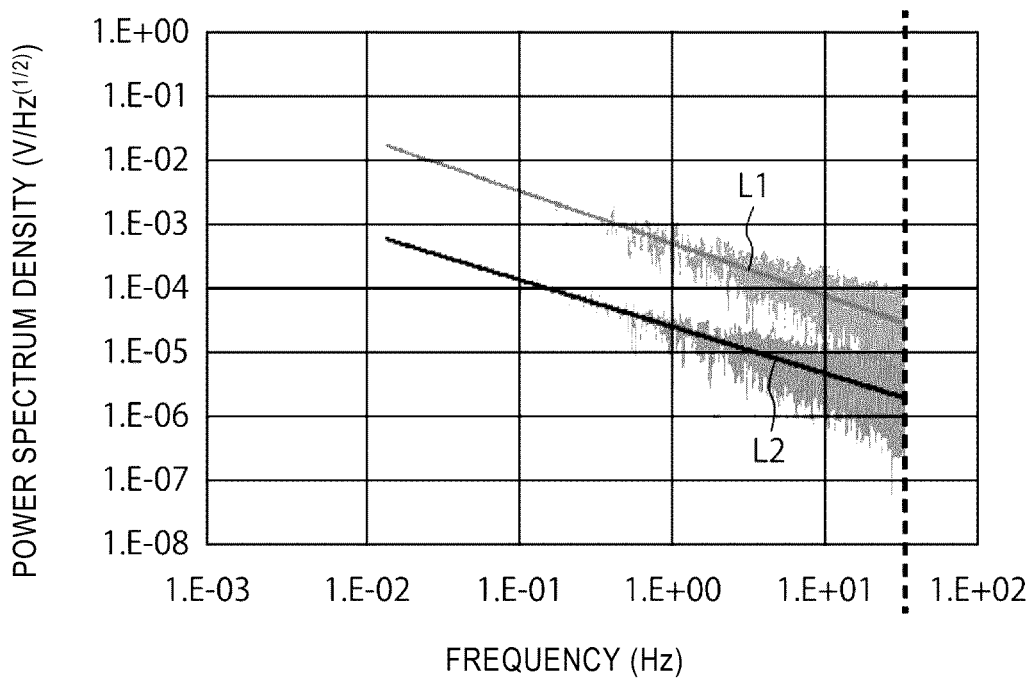
FIG. 3 is a graph depicting a power spectrum density of 1/f noise relative to a frequency of an electromotive voltage.

It is noted herein that the voltage difference Vm often contains 1/f noise and harmonics. It was confirmed that a Schottky barrier caused by a work function difference between a material film or a substrate of the DUT and the electrodes E1 to E4 in junction regions therebetween generated 1/f noise. FIG. 2 is a schematic cross-sectional view of the DUT along line 2-2 of FIG. 1. A Schottky barrier SKB is present between the electrodes E3 and E4 and the material film or substrate M (hereinafter, simply referred to as "material film M") and it is conjectured that the Schottky barrier SKB causes 1/f noise. Such 1/f noise is greater in a low-frequency region and superimposed on the voltage difference Vm. For example, FIG. 3 is a graph depicting a power spectrum density of the 1/f noise (noise magnitude) relative to a frequency of the voltage difference Vm. A horizontal axis indicates the frequency of the voltage difference Vm and a vertical axis indicates the power spectrum density ($V/Hz^{(1/2)}$) of the 1/f noise. It is noted that the vertical axis is on a logarithmic scale.

A line L1 indicates 1/f noise in a case in which a material of the electrodes E1 to E4 is aluminum, while a line L2 indicates 1/f noise in a case in which the material of the electrodes E1 to E4 is platinum. It can be understood that the 1/f noise indicated by each of the lines L1 and L2 increases extraordinarily as the frequency is lower. The voltage difference Vm containing such 1/f noise does not accurately represent the Hall electromotive voltage Vh; thus, it is impossible to calculate a correct Hall coefficient Rh with the voltage difference Vm used as it is.

To address this technical problem, according to the present embodiment, the restoration section 50 demodulates the voltage difference Vm using a demodulated signal having a phase shifted from that of a signal opposite in phase to that of the rectangular wave current I. The restoration section 50 thereby shifts the voltage difference Vm to a low-frequency side and shifts a frequency band of the voltage difference Vm largely influenced by the 1/f noise so that the frequency band is lower than 0 Hz. For example, the demodulated signal is synchronized with the rectangular wave current I and has the same frequency. The restoration section 50 thereby shifts the voltage difference Vm to the low-frequency side by, for example, approximately 50 Hz, and shifts the 1/f noise contained in a band lower than approximately 50 Hz of the demodulated voltage difference Vm so that the frequency band is lower than 0 Hz. In other words, the restoration section 50 removes the frequency band of the voltage difference Vm largely influenced by the 1/f noise. Furthermore, the restoration section 50 removes the harmonics (for example, a band equal to or higher than 100 Hz) by applying a low-pass filter to the demodulated voltage difference Vm. The restoration section 50 thereby restores the Hall electromotive voltage Vh of generally direct-current components from which the influence of the 1/f noise and the harmonics is removed to a certain extent. The Hall electromotive voltage Vh is a voltage obtained by restoring a low-frequency band (direct-current components) of, for example, 50 Hz to 100 Hz of the voltage difference Vm.

In this way, the measurement apparatus 1 according to the present embodiment measures the voltage difference Vm modulated using the rectangular wave current I, and then demodulates the voltage difference Vm using the demodulated signal set on the basis of the rectangular wave current I. The measurement apparatus 1 then uses the low-pass filter to remove the harmonic components from the demodulated voltage difference Vm. The measurement apparatus 1 can thereby restore the Hall electromotive voltage Vh of the low frequency components (direct-current components) by removing the 1/f noise and the harmonic components from the voltage difference Vm. The restoration from the voltage difference Vm to the Hall electromotive voltage Vh will be described later with reference to FIGS. 4A to 5.

The control section 40 controls the current source 20 to generate the rectangular wave current I. In addition, the control section 40 controls the restoration section 50 to restore the Hall electromotive voltage Vh.

The restoration section 50 superimposes the demodulated signal on the voltage difference Vm as described above under control of the control section 40, and further applies the low-pass filter to the voltage difference Vm. The demodulated signal is a signal that has the same frequency as that of the rectangular wave current I and that has a waveform synchronized with the rectangular wave current I. The restoration section 50 superimposes such a demodulated signal on the voltage difference Vm. Furthermore, the restoration section 50 applies the low-pass filter to the demodulated voltage difference Vm to remove the harmonic components from the demodulated voltage difference Vm. The voltage difference Vm can be thereby demodulated to the electromotive voltage Vh generated in the DUT, and a restored signal of the Hall electromotive voltage Vh by removing components of the 1/f noise (for example, components lower than 50 Hz of the voltage difference Vm) and the harmonic components of the voltage difference Vm (for example, components equal to or higher than 100 Hz of the voltage difference Vm) can be extracted. The restored signal of the Hall electromotive voltage Vh is a signal by demodulating, for example, 50 Hz to 100 Hz of the voltage difference Vm.

The computing section 60 computes various parameters obtained by measuring the Hall effect using the magnetic field B, the current I, and the low frequency components of the electromotive voltage Vh extracted by the restoration section 50. Examples of the parameters include a carrier polarity, a carrier concentration n and/or a carrier mobility μh of the DUT.

For example, when the current I is fed through the DUT and the magnetic field B is applied to the DUT in the orthogonal direction, carriers are deflected in such a manner as to cancel the Lorentz force. The voltage difference Vm is thereby generated in the orthogonal direction to the current I and the magnetic field B (diagonal direction of the electrodes E3 and E4). The voltage difference Vm is the voltage measured by the voltage measurement section 30 and contains the 1/f noise and the harmonics. The restoration section 50 then demodulates the voltage difference Vm using the demodulated signal and further passes the demodulated voltage difference Vm through the low-pass filter, thereby obtaining the electromotive voltage Vh of the low frequency components by removing the 1/f noise and the harmonics from the voltage difference Vm. This electromotive voltage Vh is nearly equal to the Hall electromotive voltage and satisfies Equation 1.

[Equation 1]
$$Vh = \frac{Rh \cdot I \times B}{t} \quad (1)$$

In Equation 1, Rh represents the Hall coefficient and t represents a thickness of the DUT (thickness of the substrate). The computing section 60 substitutes the current I, the magnetic field B, the thickness t of the DUT, and the Hall electromotive voltage Vh into Equation 1, thereby obtaining the Hall coefficient Rh. In other words, the computing section 60 calculates the Hall coefficient Rh of the DUT on the basis of the magnetic field B from the magnetic field generation section 10, the current I from the current source 20, and the Hall electromotive voltage Vh.

The Hall coefficient Rh has a relationship with the carrier concentration n as represented by Equation 2.

[Equation 2]
$$Rh = \frac{1}{qn} \quad (2)$$

In Equation 2, q represents a unit charge of electrons or holes. By substituting the Hall coefficient Rh into Equation 2, the carrier polarity and the carrier concentration n in the DUT are derived. In other words, the carrier concentration n of the DUT is calculated on the basis of the Hall coefficient Rh and the unit charge q. As for the carrier polarity, carriers can be identified as holes if a sign of the Hall coefficient Rh is + and as electrons if the sign thereof is −.

Moreover, the Hall coefficient Rh has a relationship with the carrier mobility μh as represented by Equation 3.

[Equation 3]
$$\mu_h = \frac{Rh}{\rho s} \quad (3)$$

In Equation 3, ρs represents resistivity of the DUT. The resistivity ρs can be calculated from the magnitude of the DUT, the current I, and the Hall electromotive voltage Vh. By substituting the Hall coefficient Rh into Equation 3, the carrier mobility μh in the DUT is derived. In other words, the carrier mobility μh is calculated on the basis of the Hall coefficient Rh and the resistivity ρs. These parameters (ρs, n, and μh) are essential information for understanding a conduction mechanism of a semiconductor material, and can be widely used for electrical characteristics from existing semiconductor materials (for example, silicon) to new materials.

The control section 40, the restoration section 50, and the computing section 60 may be implemented by individual CPUs or computers or may be implemented by a single CPU or computer or by a plurality of CPUs or computers.

Figure 4A:
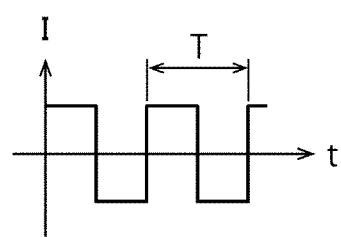
FIG. 4A is a graph depicting a rectangular wave current.

The restoration from the voltage difference Vm to the Hall electromotive voltage Vh will be described in more detail with reference to FIGS. 4A to 5. FIG. 4A is a graph depicting the rectangular wave current I. A horizontal axis indicates time and a vertical axis indicates the current I. The current I indicates a rectangular wave with a period T (the inverse of a frequency f). The frequency f is, for example, approximately 50 Hz. It is assumed, for example, that the arrow A1 of FIG. 1 indicates a current in a positive direction and the arrow A2 indicates a current in a negative direction. In this case, the rectangular wave current I alternately repeats a period in which the rectangular wave current I is fed through the DUT in the positive direction (arrow A1 direction) and a period in which the rectangular wave current I is fed through the DUT in the negative direction (arrow A2 direction) at regular intervals. A sum of the period in which the current I is fed through the DUT in the positive direction and the period in which the current I is fed through the DUT in the negative direction accounts for one cycle (for example, one cycle=1/50 s).

Figure 4B:
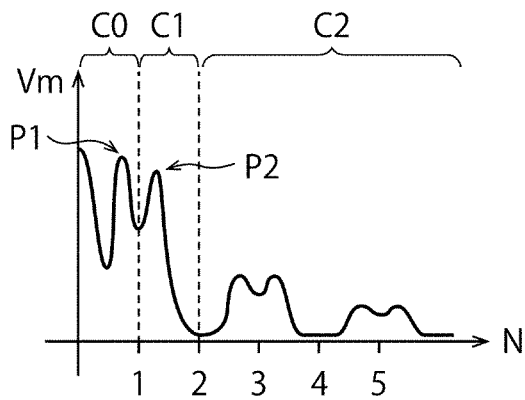
FIG. 4B is a graph depicting a voltage difference measured by a voltage measurement section.

FIG. 4B is a graph depicting the voltage difference Vm measured by the voltage measurement section 30. A horizontal axis indicates a multiple N of the frequency f with the frequency f assumed as a unit. For example, in a case in which the frequency f of the rectangular wave current I is 50 Hz, N=1 indicates 50 Hz and N=2 indicates 100 Hz. A vertical axis indicates the voltage difference Vm. Components of the voltage difference Vm in a frequency band C0 are largely influenced by the 1/f noise. Components of the voltage difference Vm in a frequency band C2 indicate the harmonic components. Components of the voltage difference Vm in a frequency band C1 are in a band between the frequency bands C0 and C2 and with a relatively small amount of the influence of the 1/f noise.

Figure 5:
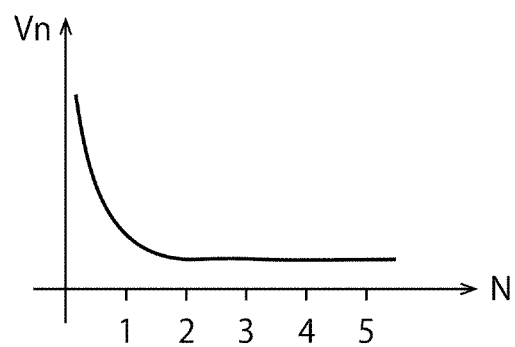
FIG. 5 is a graph depicting a frequency characteristic of 1/f noise.

FIG. 5 is a graph depicting frequency characteristic of 1/f noise Vn. A vertical axis indicates a magnitude (power spectrum density) of the 1/f noise Vn. Since the graph of FIG. 5 is on a linear scale, it can be understood that the 1/f noise Vn becomes extremely greater as the frequency is lower. If such 1/f noise Vn is superimposed on the Hall electromotive voltage Vh, a region largely influenced by the 1/f noise Vn appears in a low-frequency band (N<1) as in the region C0 of FIG. 4B.

Here, two peaks P1 and P2 appear before and after N=1 due to aliasing noise. The peak P1 is contained in the band C0 of N<1. The peak P2 is contained in the band C1 of N≥1. As can be understood by referring to FIG. 5, the band C0 of 0≤N<1 containing the peak P1 is largely influenced by the 1/f noise Vn. On the other hand the band C1 of 1≤N<2 containing the peak P2 is not largely influenced by the 1/f noise Vn.

Figure 4C:
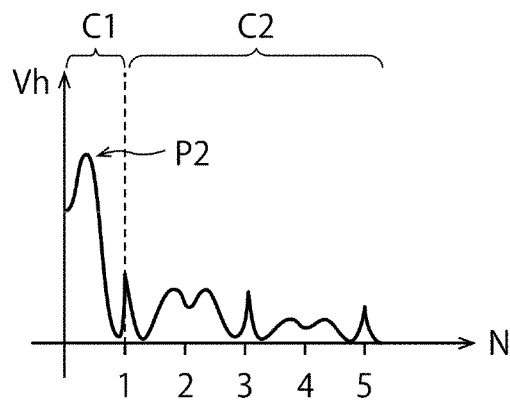
FIG. 4C is a graph depicting the electromotive voltage obtained by demodulating the voltage difference using a demodulated signal.

FIG. 4C is a graph depicting the electromotive voltage Vh obtained by demodulating the voltage difference Vm using the demodulated signal by the restoration section 50 according to the present embodiment. As described above, the demodulated signal is synchronized with the rectangular wave current I and has the same frequency as that of the rectangular wave current I. By demodulating the voltage difference Vm using such a demodulated signal, the restoration section 50 shifts the frequency band C0 containing the peak P1 of FIG. 4B to a region of N<0. The restoration section 50 can thereby remove the influence of the 1/f noise to some extent. For example, in the present embodiment, the restoration section 50 removes the 1/f noise in a band of N<1 of FIG. 5 corresponding to the band C0 is removed. On the other hand, the restoration section 50 shifts the band C1 that contains the peak P2 and that is not largely influenced by the 1/f noise to a band of 0≤N<1.

Figure 4D:
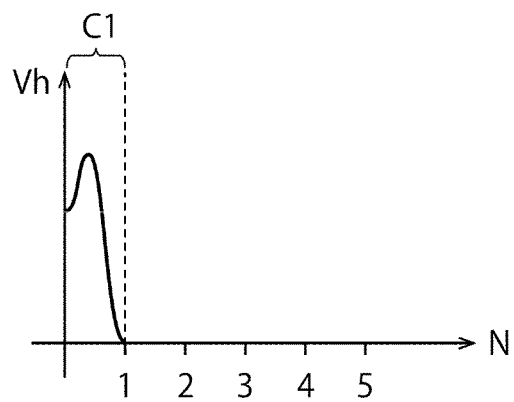
FIG. 4D is a graph depicting a waveform after a low-pass filter is applied to the electromotive voltage.

FIG. 4D is a graph depicting a waveform chart after the low-pass filter is applied to the electromotive voltage Vh of FIG. 4C obtained by demodulating the voltage difference Vm. The restoration section 50 removes the electromotive voltage Vh in the band C2 containing harmonic signals by applying the low-pass filter to the electromotive voltage Vh of FIG. 4C. The electromotive voltage Vh in the band C1 thereby remains. The electromotive voltage Vh in the band C1 is a voltage obtained by restoring components at a low frequency 1 to 2 times (1≤N<2) as high as the frequency T of the rectangular wave current I in the voltage difference Vm. Such an electromotive voltage Vh is the low frequency components (direct-current components) from which the 1/f noise and the harmonic components are removed and is close to the Hall electromotive voltage. In other words, the band C1 of FIG. 4D is the band of the Hall electromotive voltage Vh restored by the measurement apparatus 1 according to the present embodiment. The Hall electromotive voltage Vh is used to obtain the Hall coefficient Rh by the computing section 60 of FIG. 1. The Hall coefficient Rh is used to calculate the carrier polarity, the carrier concentration n, and the carrier mobility μh of the material film M of the DUT.

As described so far, according to the present embodiment, the restoration section 50 demodulates the voltage difference Vm using the demodulated signal synchronized with the rectangular wave current I, thereby shifting the voltage difference Vm to the low-frequency side and shifting the frequency band C0 of the voltage difference Vm largely influenced by the 1/f noise so that the frequency band C0 is lower than 0 Hz. The restoration section 50 thereby removes the frequency band of the voltage difference Vm largely influenced by the 1/f noise. Furthermore, the restoration section 50 removes the harmonic components by applying the low-pass filter to the demodulated voltage difference Vm. The restoration section 50 can thereby restore the Hall electromotive voltage Vh of the substantially direct-current components without the influence of the 1/f noise and the harmonic components. Calculating the Hall coefficient Rh using such a Hall electromotive voltage Vh makes it possible to calculate the accurate parameters such as the carrier mobility, the carrier concentration, and the carrier mobility of the DUT.

The restoration section 50 and other components (e.g., the control section 40, the computing section 60) in the measurement apparatus 1 according to the present embodiment may be implemented by hardware or by software. As for hardware, as appropriate, it may be a circuit (e.g., circuitry of a CPU, GPU, FPGA or other processing circuits implemented using electronic circuits), or a processor (e.g., CPU, GPU and the like) with a memory configured to implement the identified components herein. In addition, known measurement devices, detectors, or the like may be used. When the at least part of the data processing is implemented by the software, a program that realizes at least part of functions of the data processing may be stored in a recording medium such as a flexible disk, a CD-ROM, ROM, RAM, flash memory, DVD-ROM, Blu-Ray® discs and executed by causing a computer to read the program. The recording medium is not limited to a removable recording medium such as a magnetic disk or an optical disk but may be a fixed recording medium such as a hard disk apparatus or a memory. Furthermore, the program that provides the at least part of functions of the data processing may be distributed via a communication line (including wireless communication) such as the Internet. Moreover, the program may be distributed via a wired line or a wireless line such as the Internet or by storing the program in a recording medium in a state of encrypting, modulating, or compressing the program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measurement apparatus comprising:
a magnetic field generator that applies a predetermined magnetic field to a device under test;
a current source that supplies a current with a rectangular wave to the device under test in a direction crossing the magnetic field;
a voltage detector that measures a voltage difference generated in the device under test; and one or more processors configured to:
demodulate the voltage difference using a demodulated signal having a substantially similar frequency to a frequency of the rectangular wave and synchronized with the rectangular wave;
remove harmonic components from the demodulated voltage difference to restore an electromotive voltage generated in the device under test; and
measure the device under test based on the restored electromotive voltage.

2. The measurement apparatus according to claim 1, further comprising:
first and second terminals that contact two electrodes of the device under test, respectively, and that supply the current from the current source to the device under test; and
third and fourth terminals that contact other two electrodes of the device under test, respectively, and that transfer the voltage difference to the voltage measurement section.

3. The measurement apparatus according to claim 1, wherein
the one or more processors are configured to calculate a carrier polarity, a carrier concentration, and a carrier mobility of the device under test using the magnetic field from the magnetic field generation section, the current from the current source, and the restored electromotive voltage.

4. The measurement apparatus according to claim 1, wherein
the one or more processors are configured to:
calculate a resistivity of the device under test based on a current value of the current source and the restored electromotive voltage,
calculate a Hall coefficient of the device under test based on the magnetic field from the magnetic field generation section, the current from the current source, and the restored electromotive voltage,
calculate a carrier concentration of the device under test based on the Hall coefficient, and
calculate a carrier mobility of the device under test based on the Hall coefficient and the resistivity.

5. The measurement apparatus according to claim 1, wherein the frequency of the rectangular wave is represented by f, and wherein
the restored electromotive voltage is a voltage obtained by restoring low frequency components at frequencies f to 2f of the voltage difference.

6. The measurement apparatus according to claim 1, wherein
the restored electromotive voltage is a voltage obtained by restoring low frequency components at 50 Hz to 100 Hz of the voltage difference.

7. The measurement apparatus according to claim 1, wherein the frequency of the rectangular wave is represented by f, and wherein
a band from a frequency 0 to the frequency f of the voltage difference is shifted so that the band is equal to or lower than 0 by demodulating the voltage difference using the demodulated signal.

8. The measurement apparatus according to claim 7, wherein
the restored electromotive voltage is a voltage corresponding to a band from the frequency 0 to the frequency f of the demodulated voltage difference.

9. The measurement apparatus according to claim 8, wherein
the restored electromotive voltage is a voltage corresponding to a band from 0 Hz to 50 Hz of the demodulated voltage difference.

10. A method, comprising:
applying a predetermined magnetic field to a device under test;
supplying a current with a rectangular wave to the device under test in a direction crossing the magnetic field;
measuring a voltage difference generated in the device under test;
demodulating the voltage difference using a demodulated signal having a substantially similar frequency to a frequency of the rectangular wave and synchronized with the rectangular wave;
removing harmonic components from the demodulated voltage difference to restore an electromotive voltage generated in the device under test; and
measuring the device under test based on the restored electromotive voltage.

11. The method of claim 10, wherein the frequency of the rectangular wave is represented by f and further comprising:
restoring the electromotive voltage by restoring low frequency components at frequencies f to 2f of the voltage difference.

12. The method of claim 10, wherein the frequency of the rectangular wave is represented by f, and demodulating the voltage difference further comprising:
shifting a band from a frequency 0 to the frequency f of the voltage difference so that the band is equal to or lower than 0.

13. The method of claim 12, wherein
the restored electromotive voltage is a voltage corresponding to a band from the frequency 0 to the frequency f of the demodulated voltage difference.

14. A system comprising:
one or more hardware processors configured by machine-readable instructions to:
measure a voltage difference generated in a device under test, wherein the device under test is applied with a predetermined magnetic field and a current with a rectangular wave in a direction crossing the magnetic field;
demodulate the voltage difference using a demodulated signal having a substantially similar frequency to a frequency of the rectangular wave and synchronized with the rectangular wave;
remove harmonic components from the demodulated voltage difference to restore an electromotive voltage generated in the device under test; and
measure the device under test based on the restored electromotive voltage.

* * * * *